United States Patent
Barr et al.

(10) Patent No.: US 6,895,353 B2
(45) Date of Patent: May 17, 2005

(54) APPARATUS AND METHOD FOR MONITORING HIGH IMPEDANCE FAILURES IN CHIP INTERCONNECTS

(75) Inventors: Andrew H. Barr, Roseville, CA (US); Ken G. Pomaranski, Roseville, CA (US); Dale J. Shidla, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 111 days.

(21) Appl. No.: 10/453,610

(22) Filed: Jun. 4, 2003

(65) Prior Publication Data

US 2004/0249612 A1 Dec. 9, 2004

(51) Int. Cl.⁷ .............................................. G01R 31/28
(52) U.S. Cl. .................... 702/117; 702/58; 324/525; 714/733
(58) Field of Search .................. 702/117–120, 58–59, 702/64–65; 324/500, 512, 525, 532, 763, 765; 714/724, 733, 734

(56) References Cited

U.S. PATENT DOCUMENTS

| | | | | |
|---|---|---|---|---|
| 5,383,194 A | * | 1/1995 | Sloan et al. ................. | 714/724 |
| 5,444,715 A | * | 8/1995 | Gruetzner et al. .......... | 714/727 |
| 5,912,901 A | * | 6/1999 | Adams et al. .............. | 714/733 |
| 6,000,051 A | * | 12/1999 | Nadeau-Dostie et al. ... | 714/727 |
| 6,029,263 A | * | 2/2000 | Gibson ........................ | 714/726 |
| 6,087,842 A | * | 7/2000 | Parker et al. ................ | 324/763 |
| 6,097,203 A | * | 8/2000 | Parker et al. ................ | 324/763 |
| 6,286,119 B1 | * | 9/2001 | Wu et al. ..................... | 714/726 |
| 6,445,188 B1 | * | 9/2002 | Lutz et al. ................... | 324/508 |
| 6,517,369 B1 | * | 2/2003 | Butterbaugh et al. ....... | 439/327 |
| 6,614,253 B2 | * | 9/2003 | Berkely ....................... | 324/765 |
| 6,617,841 B2 | * | 9/2003 | Thao .......................... | 324/158.1 |
| 6,677,744 B1 | * | 1/2004 | Long .......................... | 324/158.1 |
| 6,724,209 B1 | * | 4/2004 | Whitten et al. ............. | 324/763 |
| 6,806,718 B2 | * | 10/2004 | Berkely ....................... | 324/500 |
| 2003/0025518 A1 | * | 2/2003 | Berkely ....................... | 324/765 |
| 2003/0213953 A1 | * | 11/2003 | Sohn et al. .................. | 257/48 |
| 2004/0104740 A1 | * | 6/2004 | Burns et al. ................ | 324/763 |
| 2004/0108866 A1 | * | 6/2004 | Burns et al. ................ | 324/763 |
| 2004/0148122 A1 | * | 7/2004 | Whitten et al. ............. | 702/120 |

* cited by examiner

Primary Examiner—Patrick J. Assouad

(57) ABSTRACT

A method and corresponding apparatus for monitoring high impedance failures in chip interconnects use monitoring circuitry on a chip to provide accurate and pro-active prediction of interconnect failures. The apparatus may include a resistance continuity monitoring circuit (RCMC), and a signal path connecting a representative set of pins to the RCMC. The RCMC measures the resistance of a connection of the representative set of pins with a circuit board during system operation and outputs a measured resistance data. The apparatus further includes additional analog-to-digital (A/D) hardware to perform an analog to digital conversion of the measured resistance data. The apparatus further includes a system interface for connecting the monitoring circuitry with other system management devices. The method then performs an algorithm on the measured resistance data, potentially warning of likely interconnect failures. The algorithm may include comparing the measured resistance data with a known threshold resistance value. Alternatively, the method displays and logs the measured resistance data for further study and analysis.

20 Claims, 3 Drawing Sheets

APPARATUS AND METHOD FOR MONITORING HIGH IMPEDANCE FAILURES IN CHIP INTERCONNECTS

TECHNICAL FIELD

The technical field relates to application specific integrated circuit (ASIC) design, and, in particular, to ASIC integrated method for monitoring high impedance failures in chip interconnects.

BACKGROUND

High impedance connections in application specific integrated circuit (ASIC) attachments can cause system failures that are extremely difficult to debug. Many new connector systems (such as sockets for ball or land grid array packages) are especially susceptible to co-planarity problems, which result in new failure modes as compared to pin and socket connectors. These failure modes present significant challenges to the design and manufacture of high quality systems. Currently there is no way to predict and proactively deal with such failure modes, since such faults don't always manifest themselves as pure 'opens,' which, by nature, are much easier to detect.

The failure modes that result from high-impedance connections vary widely from easily detectable bus errors to completely unpredictable behavior. When these types of failure modes have been seen, the typical 'solution' has been to keep swapping boards until the system starts to work again. Debugging has been done by taking resistance measurements by hand (using an Ohm meter) to determine interconnect resistance. Unfortunately, this method is extremely time-consuming and, in many cases, results in an inaccurate reading. It is also something that occurs 'after the fact.' A more precise 'in system' approach is needed.

SUMMARY

An advantage of the embodiments described herein is that they overcome the disadvantages of the prior art. Another advantage of certain embodiments is that they may detect if a pin failure occurs or pro-actively predict interconnect failures before the failures actually occur. Yet another advantage is that this prediction is accurate and performed automatically rather than manually or by hand. Still another advantage of certain embodiments is that they provide greater system uptime and a better customer experience. Another advantage of certain embodiments is that they provide means for monitoring the resistance of a representative sample of interconnect pins during operation and provide for logging the resistance information for use in debug or proactive fault management. A further advantage of certain embodiments is that printed circuit board area and cost are reduced since most of the hardware associated with monitoring resides on the chip.

These advantages and others are achieved by an apparatus for detecting high impedance failures in chip interconnects. The apparatus includes monitoring circuitry located on a chip. The monitoring circuitry includes a resistance continuity monitoring circuit (RCMC) that measures the resistance of a connection of a representative set of pins on the chip with a circuit board and outputs an analog measured resistance data. The monitoring circuitry further includes a signal path connecting the representative set of pins to the RCMC and a system interface for connecting the RCMC with other system components. The analog measured resistance data is converted to digital resistance data, which is displayed on an output device.

These advantages and others are also achieved by a method for detecting high impedance failures in chip interconnects. The method preferably measures the resistance of a connection of a representative set of pins on a chip to a circuit board using monitoring circuitry located on the chip. The measuring step produces an analog measured resistance data. The method further converts the analog measured resistance data to digital resistance data, displays the digital resistance data on an output device, and performs an algorithm on the digital resistance data.

These advantages and others are also achieved by a computer-readable medium comprising instructions for measuring the resistance of a connection of a representative set of pins on a chip to a circuit board using monitoring circuitry located on the chip. The representative set of pins connects the chip to the circuit board, and the measuring step produces an analog measured resistance data and is executed while the circuit board is operating. The computer-readable medium further includes instructions for converting the analog measured resistance data to digital resistance data, and displaying the digital resistance data on an output device, and performing an algorithm on the digital resistance data.

DESCRIPTION OF THE DRAWINGS

The detailed description will refer to the following drawings, wherein like numerals refer to like elements, and wherein.

DETAILED DESCRIPTION

A method and corresponding apparatus for monitoring high impedance failures in chip interconnects use monitoring circuitry on a chip to provide accurate and pro-active prediction of interconnect failures. The apparatus may include a resistance continuity monitoring circuit (RCMC), and a signal path connecting a representative set of pins to the RCMC. The RCMC measures the resistance of a connection of the representative set of pins with a circuit board during system operation and outputs a measured resistance data. The apparatus further includes additional analog-to-digital (A/D) hardware to perform an analog to digital conversion of the measured resistance data. The apparatus further includes a system interface for connecting the monitoring circuitry with other system management devices. The method then performs an algorithm on the measured resistance data, potentially warning of likely interconnect failures. The algorithm may include comparing the measured resistance data with a known threshold resistance value. Alternatively, the method displays and logs the measured resistance data for further study and analysis.

Figure 1:
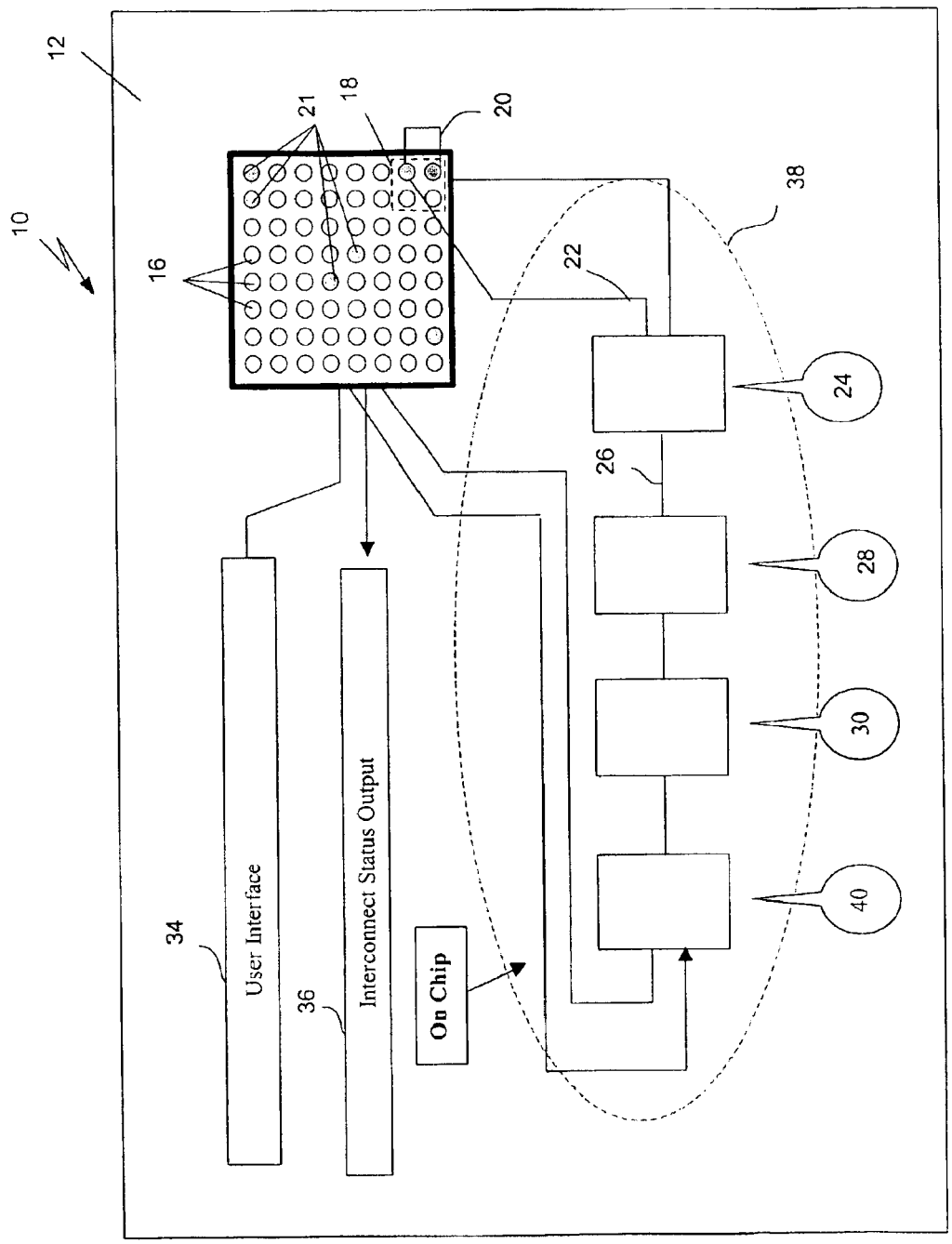
FIG. 1 shows a block diagram illustrating an embodiment of an apparatus for monitoring high impedance failures in chip interconnects.

FIG. 1 is a block diagram illustrating an embodiment of an apparatus 10 for monitoring high impedance failures in chip interconnects. System interconnects are the connections of chips into a computing system. High impedance in such circuit connections is directly correlated with the long term reliability of the connections. In other words, a circuit is more likely to fail as the connection increases from a 'direct short' (~0 ohms) to some degree of high impedance. In the embodiment shown in FIG. 1, the interconnect of an application specific integrated circuit (ASIC) 14 with a system circuit board (e.g., a server motherboard) 12 is considered, although the inventive principles described herein may apply to other specific and general purpose chips that attach and interconnect with circuit boards. The attach mechanism for the ASIC 14 may be any variety of attach mechanisms that may experience localized interconnect issues. Many of such attach mechanisms that affect one pin of the ASIC 14 or other chip would likely affect other neighboring pins in a similar fashion. Examples of such attach mechanisms include, but are not limited to, ball grid array (BGA) attach, solder column attach, surface mount and other various socketing techniques and others.

With reference again to FIG. 1, an ASIC 14 that attaches to the circuit board 12 is shown. The ASIC 14 includes representative pins 16 that interconnect with the circuit board 12. The ASIC 14 may include more or less pins 16 than shown in FIG. 1. The apparatus 10 preferably includes monitoring circuitry 38 located on the ASIC 14. The monitoring circuitry 38 may include a resistance continuity monitoring circuit (RCMC) 24, an analog-to-digital (A/D) converter 28, and a system interface 40 as depicted. This embodiment integrates all monitoring circuitry 38 on the ASIC 14 so that no special circuit board design is required to detect high impedance failures. Since each ASIC with monitoring circuitry 38 is equipped with the necessary monitoring means for detecting its own high impedance failures, printed circuit board area and cost can be significantly reduced.

The RCMC 24 is an analog precision circuit that determines the current resistance value of the interconnect of the pins 16 with the circuit board 12. The RCMC 24 may be integrated with the A/D converter 28 as a combined circuit. In the embodiment shown in FIG. 1, the RCMC 24 is connected to the A/D converter 28 preferably with a short, low loss connection interface 26. The A/D converter 28 preferably converts the analog output signal of resistance measurement data from the RCMC 24 into a digital signal. The digital signal of the resistance measurement data from the RCMC 24 is preferably sent through the on-chip system interface 40 to system management devices (not shown) on the circuit board 12, or elsewhere.

With continued reference to FIG. 1, the pins 16 of the ASIC 14 are preferably partitioned into pin areas 18 as shown. Preferably, all of the pins 16 are partitioned into pin areas 18 with a certain number of pins 16. For example, the pin areas shown are quadrants that include four pins 16. However, pin areas 18 with different numbers of pins 16 may be used. The number of pin areas 18 per chip can be chosen by balancing coverage versus cost of pin allocation. I.e., the greater number of pin areas 18 the more accuracy and better coverage. However, the cost of allocating the pins 16 into pin areas 18 increases as the number of pin areas 18 increases. The number of pin areas 18 may be reduced by partitioning only a subset of the pins 16 into pin areas 18 and/or by increasing the number of pins 16 in each pin area 18.

Each pin area 18 preferably has a representative monitored set of pins. In the present embodiment, these monitored set of pins are illustrated as the shaded pin pairs 20 seen in FIG. 1. In other embodiments, the representative monitored sets of pins may be different than a pin pair 20. For example, different patterns of pins may be selected as the representative monitored set of pins for all or some pin areas, as shown as the shaded pins 21 located at the four corners and the center of the ASIC 14. The different patterns of pins may include more than the two pins in a pin pair 20. The possible representative monitored sets of pins vary depending on the size and number of the partitioned pin areas.

The pin pairs 20 are preferably connected to the RCMC 24 via a signal path 22 so that the RCMC 24 can monitor and measure the resistance of each pin pair 20 interconnect, as shown in FIG. 1. Each pin pair 20 is preferably connected to the RCMC 24 via a separate signal path 22. Alternatively, the pin pairs 20 may be connected to the RCMC 24 via a single signal path 22 connecting all the pin pairs 20 or by multiple signal paths 22 at least some of which connect a plurality of pin pairs 20. However implemented, the signal path 22 is preferably accomplished through routing on the ASIC 14 and routing a trace on the circuit board 12 to connect the pin pairs 20 to form a closed loop of daisy-chained pins 16 (or pin pairs 20 if connecting more than one pin pair 20 in the signal path 22).

In using the apparatus 10 for detecting and rejecting high impedance failures, the assumption is that the interconnect resistance measurements of the representative monitored set of pins in a pin area 18, e.g., pin pair 20, apply to the other pins 16 in the pin area 18. In other words, the conditions of the pin pair 20, as determined from the resistance measurements, are likely also the conditions of the other pins 16 in the pin area 18. Therefore, if the resistance measurements of the pin pair 20 interconnect indicates an imminent failure, the other pins 16 in the pin area 18 are likely also imminently failing.

The RCMC 24 measures the resistance of the entire signal path 22, including the resistance of the pin pairs 20 interconnects and the trace on the ASIC 14. Preferably, the resistance of the trace is minimized so that measured resistance is the resistance of the pin pairs 20 interconnect. The resistance of the pin pair 20 interconnect is the resistance to a signal flowing from the circuit board 12 to the ASIC 14 through the pin pair 20. Alternatively, the resistance of the trace is known and normalized out of the measurement.

The measured resistance data of the pin pairs 20 interconnect is then transmitted to system management devices, as described above, for further processing. For example, other components on the circuit board 12, including, for example, a processor (not shown) executing instructions stored in memory (not shown), may receive the resistance data via the system interface 40 and perform various algorithms on the resistance data. For example, the measured resistance data may be compared to known values of pin pairs 20 interconnect resistance. These known values, for example, may specify a threshold resistance value for the pin pairs 20 interconnect. If the measured resistance data is greater than the threshold resistance value, it may be determined that an interconnect failure is imminent. In principle, as the resistance increases, the likelihood of failure increases.

If the measured resistance data indicates that a failure is imminent or has occurred, the system management devices take appropriate actions, such as signaling the user or system support personnel. The ASIC 14 or circuit board 12 may be replaced or the data may be further analyzed depending on the likelihood of interconnect failure as determined by the system management devices algorithms.

Different algorithms and threshold resistance values may be desired for different applications. For example, for a critical application with high speed, the threshold resistance value may be set low so that a small change in resistance will trigger a failure signal. On the other hand, for a less critical application, the threshold resistance value may be set higher so that the apparatus 10 may not show a failure signal until the measured resistance of the pin pairs 20 interconnect has changed significantly and a failure is imminent.

Figure 2:
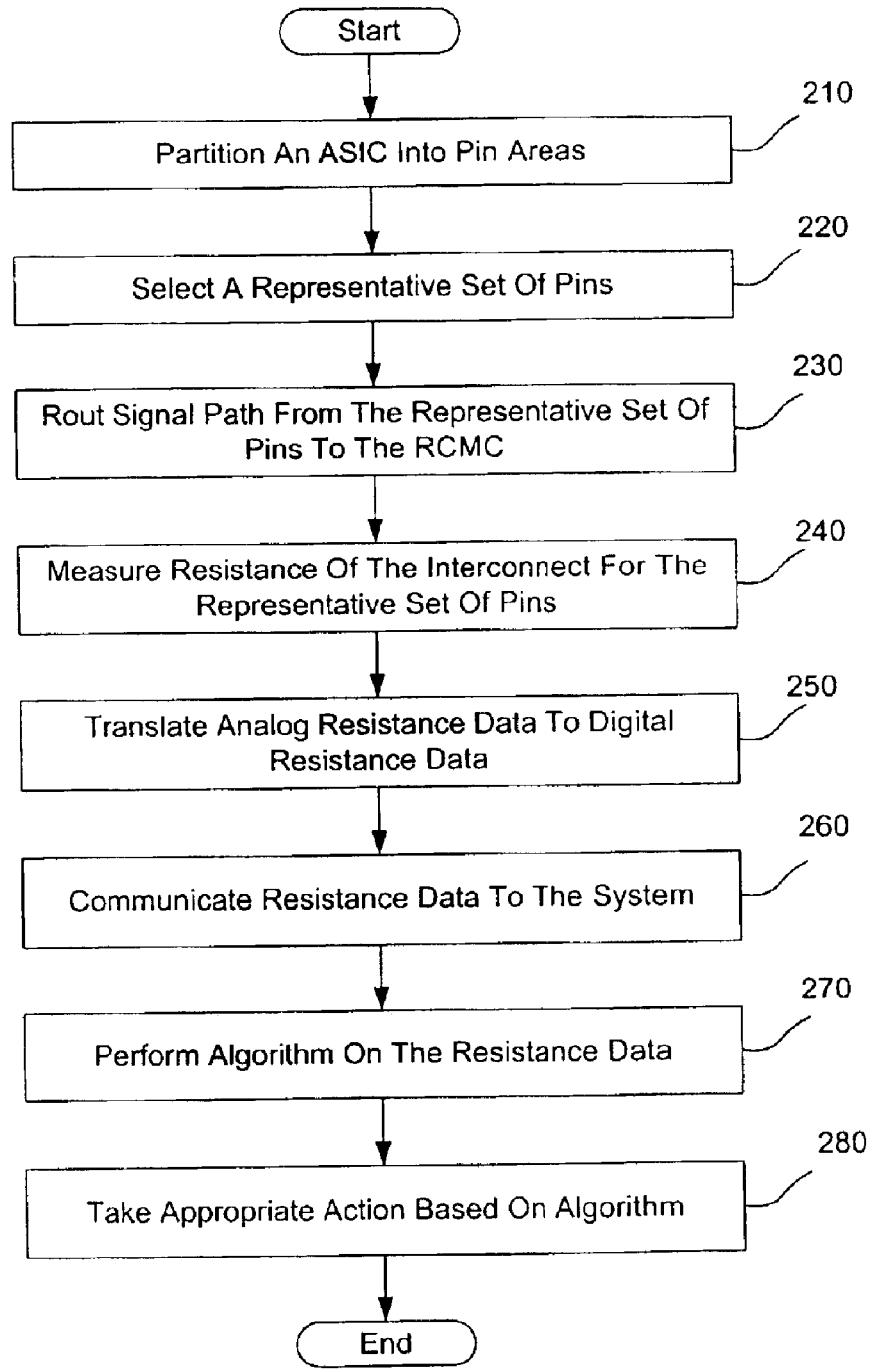
FIG. 2 is a flowchart illustrating an exemplary embodiment of a method for monitoring high impedance failures in chip interconnects.

FIG. 2 is a flowchart illustrating an exemplary method for monitoring high impedance failures in chip interconnects. The method partitions an ASIC 14 (or other chip) into pin areas 18 (step 210), selects a representative set of pins (step 220) and routes a signal path from the representative set of pins to a RCMC (step 230). The method then measures resistance of the interconnect of the representative set of pins (step 240). Next, the method translates the analog resistance data to digital resistance data (step 250) and communicates the digital resistance data to the system (step 260). Further, the method performs an algorithm analysis on the digital resistance data (step 270). The algorithm preferably determines whether a high impedance failure is imminent by, for example, comparing the digital resistance data to a threshold value. The system then takes appropriate action based on the results of the algorithm performed on the digital resistance data (step 280). Steps 210–230 are preferably performed during the design phase. Steps 240–290 are preferably performed while the system (e.g., including the board 12 and the ASIC 14) is running. Moreover, steps 240–280 may be repeated as often as desired.

Figure 3:
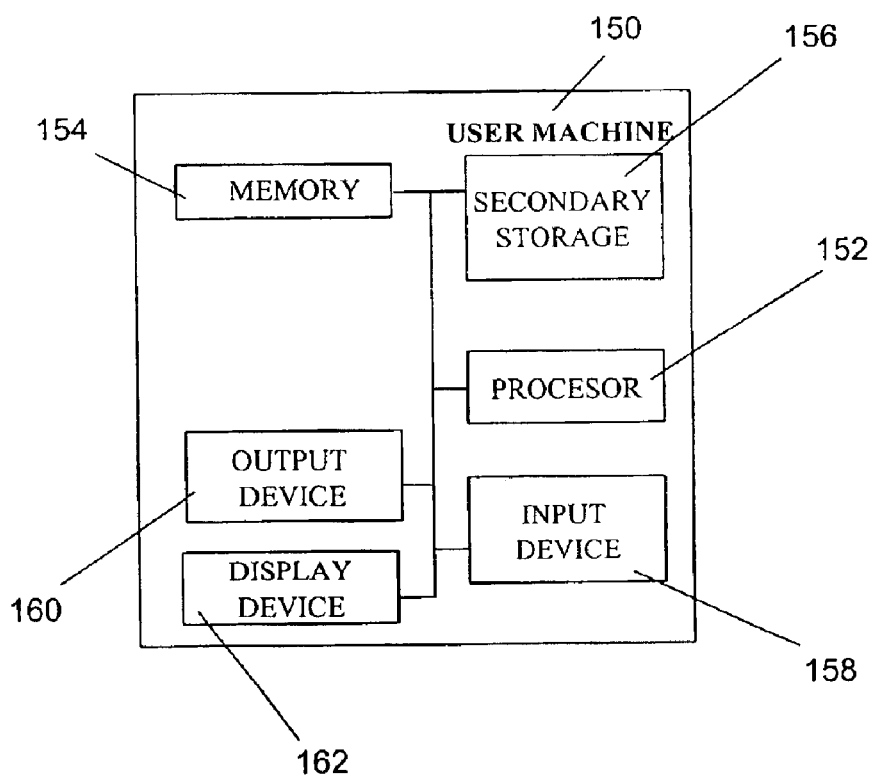
FIG. 3 illustrates exemplary hardware components of a computer that may be used in connection with the method for monitoring high impedance failures in chip interconnects.

The algorithm of the above-described methods may be implemented as software. The software may be stored on a computer-readable medium as instructions for executing the above-described methods. Accordingly, with reference now to FIG. 3, illustrated is a user machine 150 that comprises a processor 152, a memory 154, a secondary storage device 156, an input device 158, an output device 160 and a display device 162. The processor 152 is preferably connected to a circuit board (e.g., circuit board 12) for which the methods will be executed. The instructions for executing the above-described methods are preferably stored in the secondary storage device 156 and, when executed by the processor 152, the memory 154. The memory 154 or secondary storage device 156 may include the register for storing the measured resistance data as well as the log for logging results. The memory 154 and secondary storage device 156 are computer-readable mediums.

While the method and apparatus for monitoring high impedance failures in chip interconnects have been described in connection with an exemplary embodiment, those skilled in the art will understand that many modifications in light of these teachings are possible, and this application is intended to cover any variations thereof.

What is claimed is:

1. An apparatus for monitoring high impedance failures in system interconnects, comprising:
    monitoring circuitry located on a chip, comprising:
        a resistance continuity monitoring circuit (RCMC), wherein the RCMC measures the resistance of a connection of a representative set of pins on the chip with a circuit board, outputting an analog measured resistance data;
        a signal path connecting the representative set of pins to the RCMC; and
        a system interface for connecting the RCMC with other system components;
    wherein the monitoring circuitry converts the analog measured, resistance data to digital resistance data and displays the digital resistance data on an output device.

2. The apparatus of claim 1, wherein the chip is an application specific integrated circuit.

3. The apparatus of claim 1, further comprising:
    an analog-to-digital (A/D) converter, wherein the A/D converter converts the analog measured resistance data to the digital resistance data.

4. The apparatus of claim 3, wherein the A/D converter and the RCMC are integrated as a combined circuit.

5. The apparatus of claim 1, wherein the monitoring circuitry logs the digital resistance data.

6. The apparatus of claim 1, wherein the chip is partitioned into a plurality of pin areas and each pin area includes a representative set of pins, the apparatus further comprising a plurality of signal paths, wherein each signal path connects a representative set of pins to the RCMC and the RCMC measures the resistance of a connection of each representative set of pins with the circuit board.

7. The apparatus of claim 6, wherein the chip includes four corners and a center and partitioned into five areas, with one pin area in each of the four corners and the center.

8. The apparatus of claim 1, wherein the chip is partitioned into a plurality of pin areas and each pin area includes a representative set of pins, wherein the signal path connects a plurality of representative set of pins in one or more pin areas to the RCMC and the RCMC measures the resistance of a connection of the plurality representative set of pins with the circuit board.

9. The apparatus of claim 1, wherein the other system components include a processor that runs instructions controlling the operation of the RCMC.

10. The apparatus of claim 9, wherein the processor processes the digital resistance data.

11. A method for detecting high impedance failures in system interconnects, comprising steps of:
    measuring the resistance of a connection of a representative set of pins on a chip to a circuit board using monitoring circuitry located on the chip, wherein the measuring step produces an analog measured resistance data;
    converting the analog measured resistance data to digital resistance data;
    displaying the digital resistance data on an output device; and
    performing an algorithm on the digital resistance data.

12. The method of claim 11, further comprising a step of:
    taking appropriate action based on results of the algorithm performed on the digital resistance data.

13. The method of claim 11, wherein the chip is partitioned into a plurality of pin areas and each pin area includes a representative set of pins, and the method further comprising a step of:
    routing a signal path from a representative set of pins in each pin area to a RCMC, wherein the RCMC measures the resistance of a connection of each representative set of pins with the circuit board.

14. The method of claim 11, wherein the chip is partitioned into a plurality of pin areas and each pin area includes a representative set of pins, and the method further comprising a step of:
    routing a signal path from a plurality representative set of pins in one or more pin areas to a RCMC, wherein the RCMC measures the resistance of a connection of the plurality representative set of pins with the circuit board.

15. The method of claim 11, further comprising the steps of:

partitioning the chip into pin areas, wherein each pin area includes pins connecting the chip to a circuit board; and selecting the representative set of pins in a pin area.

16. The method of claim 11, wherein chip includes four corners and a center and wherein the partitioning step partitions the chip into five pin areas, one pin area for each of the four corners and the center.

17. The method of claim 11, further comprising a step of:

communicating the measured resistance data to system management devices, wherein the system management devices execute the algorithm performing step.

18. The method of claim 11, further comprising a step of:

logging the digital resistance data.

19. A computer-readable medium comprising instructions for monitoring high impedance failures in system interconnects, the instructions comprising:

measuring the resistance of a connection of a representative set of pins on a chip to a circuit board using monitoring circuitry located on the chip, wherein the measuring step produces an analog measured resistance data;

converting the analog measured resistance data to digital resistance data;

displaying the digital resistance data on an output device; and performing an algorithm on the digital resistance data.

20. The computer-readable medium of claim 19, further comprising instructions for:

communicating the measured resistance data to a system management devices, wherein the system management devices execute the algorithm performing step.

* * * * *

UNITED STATES PATENT AND TRADEMARK OFFICE
CERTIFICATE OF CORRECTION

PATENT NO. : 6,895,353 B2  
APPLICATION NO. : 10/453610  
DATED : May 17, 2005  
INVENTOR(S) : Andrew H. Barr et al.

Page 1 of 1

It is certified that error appears in the above-identified patent and that said Letters Patent is hereby corrected as shown below:

IN THE SPECIFICATION

Column 3, line 5, insert paragraph break between "impedance." and "In the"

IN THE CLAIMS

Claim 1, Column 5, line 66, after "measured" delete ","

Claim 20, Column 8, line 13, after "data to" delete "a"

Signed and Sealed this

Twenty-seventh Day of May, 2008

JON W. DUDAS  
*Director of the United States Patent and Trademark Office*